(12) United States Patent
Cortigiani et al.

(10) Patent No.: US 7,944,269 B2
(45) Date of Patent: May 17, 2011

(54) POWER TRANSISTOR AND METHOD FOR CONTROLLING A POWER TRANSISTOR

(75) Inventors: Fabrizio Cortigiani, Padua (IT); Franco Mignoli, Verona (IT); Gianluca Ragonesi, Padua (IT); Silvia Solda, Padua (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/238,531

(22) Filed: Sep. 26, 2008

(65) Prior Publication Data
US 2010/0079190 A1   Apr. 1, 2010

(51) Int. Cl.
*H01L 35/00* (2006.01)
(52) U.S. Cl. .......... 327/512; 327/513; 361/103
(58) Field of Classification Search .......... 327/512, 327/513; 361/103
See application file for complete search history.

(56) References Cited

U.S. PATENT DOCUMENTS

| 4,875,131 | A | * | 10/1989 | Leipold et al. ............ 361/103 |
| 5,070,322 | A | * | 12/1991 | Fujihira ............ 340/653 |
| 5,349,336 | A | | 9/1994 | Nishiura et al. |
| 5,434,443 | A | * | 7/1995 | Kelly et al. ............ 257/467 |
| 5,994,752 | A | | 11/1999 | Sander et al. |
| 2005/0258464 | A1 | | 11/2005 | Zundel et al. |

FOREIGN PATENT DOCUMENTS

| EP | 1755221 A1 | 2/2007 |
| EP | 1876710 A1 | 1/2008 |

OTHER PUBLICATIONS

Siemens BUZ 80; Semiconductor Group; Sep. 1996; pp. 1-9.

* cited by examiner

*Primary Examiner* — Kenneth B. Wells

(57) ABSTRACT

Embodiments of the invention are related to a power transistor and a method for controlling a power transistor. In one embodiment a power transistor comprises a power semiconductor body with a plurality of power transistor cells each having a control electrode and a current path. The power transistor furthermore comprises a temperature sensor formed by at least one transistor cell in the power semiconductor body whose control electrode is coupled to one electrode of the current path forming a reversed biased pn-junction.

13 Claims, 1 Drawing Sheet

POWER TRANSISTOR AND METHOD FOR CONTROLLING A POWER TRANSISTOR

FIELD OF THE INVENTION

The invention relates to a power transistor having a plurality of transistor cells and a thermal sensor and to a circuit with such a power transistor.

BACKGROUND

Power transistors usually are used with high currents and high voltages and therefore can become excessively heated. Excessive power dissipation can lead to a high temperature of the power transistor. To protect the power transistor against thermal damage, the temperature of the power transistor is determined in order to take some protective action, like for example to reduce current flow through the power transistor.

SUMMARY OF THE INVENTION

According to one embodiment a power transistor comprises a power semiconductor body with plurality of power transistor cells each having a control electrode and a current path. A temperature sensor is formed by at least one transistor cell having a control electrode and a current path in the power semiconductor body whose control electrode is coupled to one electrode of the current path forming a reversed biased pn-junction.

According to a further embodiment the power transistor is a MOS power transistor comprising a power semiconductor body with plurality of power transistor cells each having a gate electrode, a drain region and a source region. The MOS power transistor comprises further at least one temperature sense cell formed by at least one MOS transistor cell in the power semiconductor body whose gate electrode is coupled to its source region forming a reversed biased pn-junction. A control circuit is provided being coupled to the at least one temperature sense cell and to the gate electrodes of the plurality of power transistor cells and being adapted to determine a leakage current through the at least one temperature sense cell and to deactivate the power transistor cells if the leakage current exceeds a temperature threshold, wherein the drain regions of the power transistor cells and of the at least one temperature sense cell are coupled together.

A method for controlling a power transistor comprising a plurality power transistor cells is also disclosed. In one embodiment the power transistor is switched on periodically for at most a maximum on-time. The maximum on-time is short enough to limit the temperature reachable by the plurality of power transistor cells during the maximum on-time to a value acceptable for the plurality of power transistor cells.

Figure 1:
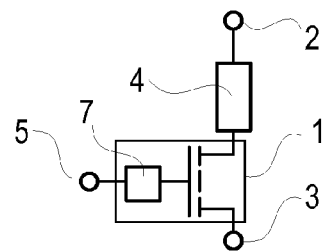
FIG. 1 is a diagram of a circuit using a power transistor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 depicts a circuit arrangement that includes a power transistor 1 to control a current through an electric component 4. In one embodiment the electric component 4 is a load to be powered. Transistor 1 and the electric component 4 are coupled in series between two supply voltage terminals 2, 3. In this embodiment supply voltage terminal 2 is coupled to a positive potential and supply voltage terminal 3 is coupled to a negative potential. Transistor 1 is n-channel MOS transistor having a source region coupled to the negative supply terminal 3 and a drain region coupled to the electric component 4. In this configuration transistor 1 can be named also low side transistor.

Transistor 1 furthermore comprises a gate electrode that is coupled to an output of a control circuit 7. An input of the control circuit 7 is coupled to a control terminal 5. The control circuit 7 is adapted to process a control signal received at its input and to control the gate electrode of transistor 1 dependent on the control signal. In one embodiment the control circuit 7 includes a safety mechanism that inhibits the activation of transistor 1 in case of excessive temperature or in case of other dangerous operating conditions. In other embodiments the control circuit 7 is adapted to shape the control signal, for example by amplifying it before applying it to the gate electrode of transistor 1, or by comparing the control signal with a threshold and switching on the transistor 1 only if the control signal exceeds the threshold.

Figure 2:
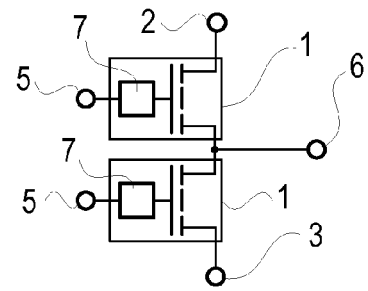
FIG. 2 is a diagram of a circuit using a power transistor according to a further embodiment.

FIG. 2 depicts a further circuit arrangement comprising a first power transistor 1 coupled in series with a second power transistor 1 between two voltage supply terminals 2, 3. The first transistor 1 is coupled to supply voltage terminal 2 and the second transistor 1 is coupled to supply voltage terminal 3. Both transistors 1 are n-channel MOS transistors. The second transistor 1 also comprises a gate electrode coupled to a control terminal 5. The connection point between both transistors 1 is coupled to an output terminal 6. In this configuration the first transistor 1 can be referred to as a low side transistor and the second transistor 1 as a high side transistor.

The energy of the power dissipated in a transistor 1 can lead to excessive temperature of the transistor 1 and can damage it. Thus, each transistor 1 comprises a temperature sensor.

The circuit arrangements shown in FIG. 1 and FIG. 2 in one embodiment are parts of switched power supplies. A switched power supply can be for example a pulse width modulated driver.

Figure 3:
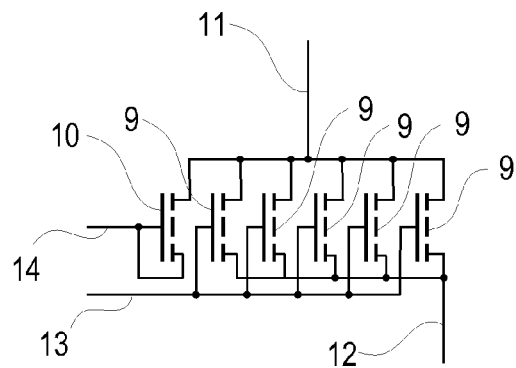
FIG. 3 is a circuit diagram of a power transistor according to an embodiment.

FIG. 3 depicts an embodiment of a power transistor 1 comprising a plurality of MOS transistor cells 9, 10. Each of the plurality of MOS transistor cells 9, 10 comprise a gate electrode, a source region and a drain region. All MOS transistor cells 9, 10 are formed within a single power semiconductor body. The MOS transistor cells 9, 10 in one embodiment are arranged in an array. The MOS transistor cells 9, 10 comprise a plurality of power transistor cells 9 and at least one temperature sense cell 10 forming a temperature sensor. In the depicted embodiment there are one temperature sense cell 10 and five power transistor cells 9.

The drain regions of all MOS transistor cells 9, 10 are coupled together to a drain connection 11. The source regions of the power transistor cells 9 are coupled together to a source connection 12. The gate electrode of the power transistor cells 9 are coupled together to a gate connection 13. Thus, all power transistor cells 9 are coupled in parallel forming one power transistor having a gate connection 13, a drain connection 11 and a source connection 12.

The gate electrode of the temperature sense cell 10 is coupled to the source region of the temperature sense cell 10, forming a reverse-biased pn-junction. The source region of the temperature sense cell 10 is coupled to a temperature sense connection 14. Thus, if a voltage is applied to temperature sensor 10 a leakage current flows, which depends on the temperature of the temperature sense cell 10. By measuring this leakage current the temperature of the power semiconductor body can be determined.

In other embodiments there may be more than one temperature sense cell 10. If there is a plurality of temperature sense cells 10, several or all of the plurality of the temperature sense cells 10 may be coupled in parallel, forming one temperature sensor. If more than one temperature sense cell 10 is provided, the temperature sense cells 10 can be located spaced apart from each other with least one power transistor cell 9 in between.

Figure 4:
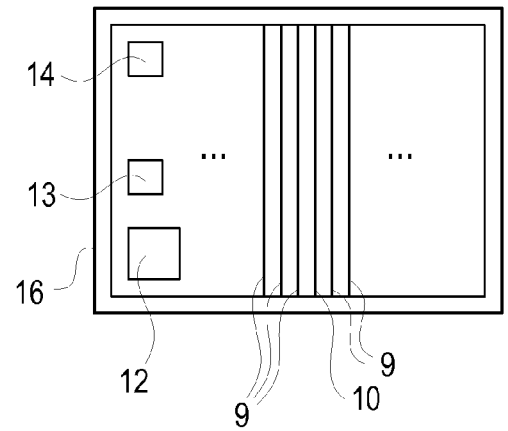
FIG. 4 is a top view of a power semiconductor body comprising transistor cells of the power transistor according to a further embodiment.

FIG. 4 depicts a power semiconductor body 16 comprising the transistor of FIG. 3. The power semiconductor body 16 is a silicon chip in which a plurality of power transistor cells 9 and a temperature sense cell 10 are formed. There is one temperature sense cell 10 located in between a plurality of power transistor cells 9.

The plurality of power transistor cells 9 and the temperature sense cell 10 are longitudinal cells and all of the same type in one embodiment. In other embodiments the shape for the plurality of power transistor cells 9 and the temperature sense cell 10 may also be different.

In this embodiment the source connection 12 and the gate connection 13 of the power transistor cells 9 are pads on the top side of the power semiconductor body 16. Also the temperature sense connection 14 of the temperature sense cell 10 in this embodiment is a pad on the top side of the power semiconductor body 16. The drain connection of the transistor cells 9, 10 is located on the backside of the power semiconductor body 16.

In further embodiments the power transistors 1 comprise a control circuit for measuring the temperature of the power semiconductor body 16. The control circuit is coupled to the temperature sensor 10 and is adapted to measure a current flowing through the temperature sensor 10. In an embodiment the control circuit is interposed in the connection of the gate electrodes of the power transistor cells 9. Thus, the control circuit has control of the signal applied to the gate electrode of the power transistor cells 9 and can reduce a current flow through the power transistor cells 9, if the temperature is too high. By reducing the current power dissipation, the temperature of the power transistor 1 can be reduced. The control circuit can be integrated with the power transistor in one package.

Figure 5:
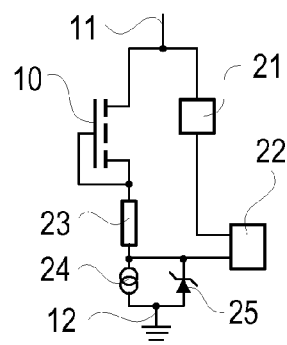
FIG. 5 is a circuit diagram of a control circuit used with a power transistor according to a further embodiment.

FIG. 5 depicts a control circuit according to an embodiment together with a temperature sense cell 10. The drain of the temperature sense cell 10 is coupled to the drain connection 11 of the power transistor 1 and is formed within the power semiconductor body 16. The source of the temperature sense cell 10 is coupled in series first with a resistor 23 and then with a current source 24 to a ground potential which in this embodiment is the source connection 12 of the power transistor 1. Current source 24 is coupled in parallel to a reversed biased Zener diode 25. The connection point between resistor 23 and current source 24 is coupled to an input of a deactivation circuit 22. The drain connection 11 of the power transistor 1 is coupled to an input of a high pass filter 21 whose output is coupled to a further input of the deactivation circuit 22.

The current through the temperature sense cell 10, the resistor 23 and the current source 24 causes a voltage drop across the current source 24. As soon as the current through the temperature sense cell 10 exceeds the nominal value for the current of the current source 24, the voltage across the current source 24 rises. The deactivation circuit 22 is adapted to detect this voltage increase across current source 24. The voltage increase across current source 24 is limited by the Zener diode 25. Furthermore the deactivation circuit 22 is adapted to measure the output signal of the high pass filter 21 and to generate a deactivation signal if the voltage across the current source 24 is above a temperature threshold and the output of the high pass filter 21 is below a filter threshold.

The output signal of the high pass filter 21 indicates whether the potential at the drain connection 11 is changing. If the potential at the drain connection 11 is changing, the internal capacitances of the power transistor 1 are charged or discharged. These charging processes can cause current flows through the transistor cells 9, 10 and can affect the determination of the temperature by measuring the current through the temperature sense cell 10. Thus, by generating the deactivation signal, only if the output signal of the high pass filter 21 is below a filter threshold, a deactivation at acceptable temperature only due to voltage changes at the drain connection 11 can be avoided.

Figure 6:
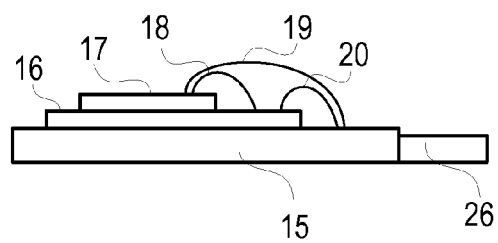
FIG. 6 is a side view of power transistor according to a further embodiment.

FIG. 6 depicts an embodiment of the power transistor 1 comprising a control circuit in a separate control semiconductor body 17. The transistor cells 9, 10 are formed in a power semiconductor body 16. The power semiconductor body 16 and the control semiconductor body 17 are mounted chip-on-chip on a lead frame 15.

The lead frame 15 comprises pins 26 for connecting the power transistor 1. In the depicted embodiment the power transistor 1 comprises two pins 26 which are located in the same plane as the lead frame 15. One pin 26 is used to connect as control input 5 of the transistor 1. A further pin 26 is used to connect the source regions of the power transistor cells 9. The drain regions of the transistor cells 9, 10 are coupled through the backside of the power semiconductor body 16 to the lead frame 15. In order to connect the control circuit 7 in the control semiconductor body 17 and the transistor cells 9, 10 in the power semiconductor body 16 to the respective pin 26, bond wires 18, 19, 20 are provided. Bond wires 18 couple the gate connection 13 of the power transistor cells 9 and the gate electrode of the temperature sense cell 10 to the control circuit 7. Bond wire 20 couples the source connection 12 to the respective pin 26.

The semiconductor bodies 16, 17 and the bond wires 18, 19, 20 furthermore are encapsulated in an insulating material.

However, in a further embodiment the control circuit 7 may also be formed in the same semiconductor body as the transistor cells 9, 10.

In one embodiment the power transistor 1 comprises three terminals. A first terminal is coupled to the drain regions of the transistor cells 9, 10. A second terminal is coupled to the source regions of the power transistor cells 10 and a third terminal is coupled to an input of the control circuit 7.

If the power transistor 1 is used in a switched power supply circuit arrangement, the temperature of the temperature sense cells 9 can be determined during the off-phase of the power transistor 1. In the off-phase, when there is no current flow through the power transistor cells 10, there is a high voltage across drain and source of the power transistor 1 that provides for temperature measurement and for powering the control circuit 7 to inhibit activation of the power transistor cells 10.

In the on-phase, a high current flows through the power transistor 1 and the voltage across drain and source is low and may be too low to carry out a temperature measurement. If a short circuit occurs or the current flow becomes too high during this on-phase, the reduced voltage may prevent temperature determination or the protection circuit may not work. In this case the temperature of the power transistor 1 would increase until the next off-phase. Since in a switched power supply the on-phase is time-limited, the temperature increase is limited. During the following off-phase, the voltage across drain and source is high again and the temperature can be measured. If an excessive temperature is detected, the power transistor is deactivated and flow is inhibited during the next on-phase current.

The on-phase is short enough to limit the temperature increase reachable by the plurality of power transistor cells to an acceptable value. This can be achieved since the power transistor has a certain thermal capacity that limits the temperature increase of the power transistor cells.

The invention claimed is:

1. A power transistor comprising:
   a power semiconductor body comprising a plurality of MOS transistor cells, wherein the plurality of MOS transistor cells comprise
      at least one temperature sense cell comprising a drain, a gate, and a source, wherein the gate is coupled to the source, and
      a plurality of power transistor cells each comprising a drain, a gate, and a source, wherein the drain of each of the plurality of power transistor cells is coupled to the drain of the at least one temperature sense cell; and
   a control circuit coupled to the at least one temperature sense cell and to the gate of each of the plurality of power transistor cells, being powered by the voltage across the drain and source of each of the plurality of power transistor cells and adapted to deactivate the plurality of power transistor cells if a leakage current through the at least one temperature sense cell exceeds a threshold.

2. The power transistor of claim 1, wherein the control circuit comprises a high pass filter having an input coupled to the drain of each of the plurality of power transistor cells, and wherein the control circuit is adapted to deactivate the plurality of power transistor cells if an output signal of the high pass filter is below a filter threshold.

3. The power transistor of claim 1, further comprising a control semiconductor body, wherein the control semiconductor body comprises the control circuit.

4. The power transistor of claim 3, wherein the power semiconductor body is coupled to the control semiconductor body.

5. The power transistor of claim 1, further comprising:
   a drain terminal coupled to the drain of each of the plurality of power transistor cells and to the drain of the at least one temperature sense cell;
   a source terminal coupled to the source of each of the plurality of power transistor cells; and
   a control terminal coupled to the control circuit.

6. The power transistor of claim 5, further comprising a supply terminal coupled to the control circuit and adapted to provide a supply voltage to the control circuit.

7. A power transistor comprising:
   a power semiconductor body comprising
      a temperature sensor formed by at least one transistor cell having a control electrode and a current path, the control electrode coupled to an electrode in the current path and forming a reverse-biased pn-junction, and
      a plurality of power transistor cells each having a control electrode and a current path and coupled to the temperature sensor,
   a control circuit coupled to the temperature sensor and adapted to measure a leakage current through the temperature sensor and to control the control electrode of each of the plurality of power transistor cells based on a control signal received by the control circuit, the control circuit being adapted to deactivate the plurality of power transistor cells if the leakage current through the temperature sensor exceeds a threshold,
   wherein the control circuit comprises a high pass filter coupled to the plurality of power transistor cells, and wherein the control circuit is adapted to deactivate the plurality of power transistor cells if an output signal of the high pass filter is below a filter threshold.

8. The power transistor of claim 7, wherein the current path of each of the plurality of power transistor cells is coupled to the current path of the at least one transistor cell.

9. The power transistor of claim 8, wherein the plurality of power transistor cells and the at least one transistor cell comprise MOS transistor cells each having a gate, a drain, and a source, and wherein the drains of the MOS transistor cells are coupled together.

10. The power transistor of claim 7, wherein the plurality of power transistor cells and the at least one transistor cell comprise MOS transistor cells each having a gate, a drain, and a source, and wherein the gate and the source of the at least one transistor cell are coupled together.

11. The power transistor of claim 7, further comprising a control semiconductor body comprising the control circuit.

12. The power transistor of claim 11, further comprising a lead frame, wherein the power semiconductor body is mounted on the lead frame and the control semiconductor body is mounted on the power semiconductor body.

13. The power transistor of claim 7, wherein the plurality of power transistor cells and the at least one transistor cell comprise the same structure.

* * * * *